US011463084B1

(12) United States Patent
Ganesan et al.

(10) Patent No.: US 11,463,084 B1
(45) Date of Patent: Oct. 4, 2022

(54) LEVEL SHIFTING OUTPUT CIRCUIT

(71) Applicant: Advanced Micro Devices, Inc., Santa Clara, CA (US)

(72) Inventors: Thanapandi Ganesan, Tamilnadu (IN); Prateek Mishra, Uttar Pradesh (IN); Jagadeesh Anathahalli Singrigowda, Bangalore (IN); Dhruvin Devangbhai Shah, Ahmedabad (IN); Animesh Jain, Bangalore (IN); Girish Anathahalli Singrigowda, Bangalore (IN)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/464,009

(22) Filed: Sep. 1, 2021

(51) Int. Cl.
  *H03K 17/687* (2006.01)
  *H03K 5/003* (2006.01)

(52) U.S. Cl.
  CPC ......... *H03K 17/6871* (2013.01); *H03K 5/003* (2013.01)

(58) Field of Classification Search
  CPC .......................... H03K 5/003; H03K 17/6871
  See application file for complete search history.

(56) References Cited

U.S. PATENT DOCUMENTS

| | | | |
|---|---|---|---|
| 10,305,474 B2 | 5/2019 | Lee | |
| 10,992,290 B2 | 4/2021 | Kim et al. | |
| 2015/0280714 A1* | 10/2015 | Kumar | H03K 19/0185 327/333 |
| 2016/0072502 A1 | 3/2016 | Chern et al. | |
| 2021/0067158 A1 | 3/2021 | Wu | |

* cited by examiner

*Primary Examiner* — Metasebia T Retebo
(74) *Attorney, Agent, or Firm* — Zagorin Cave LLP

(57) ABSTRACT

A level shifting output circuit converts a signal from a core voltage to an I/O voltage without causing voltage overstress on transistor terminals in the level shifting output circuit. The output circuit includes protection transistors to protect various transistors in the output circuit from overvoltage conditions including those transistors coupled to I/O power supply nodes.

24 Claims, 11 Drawing Sheets

Input=0V

| Device | |Vgs(V)| | |Vds(V)| | |Vgd(V)| | Stress Level |
|---|---|---|---|---|
| MN1 | 0.75 | 0 | 0.75 | PASS |
| MN3 | VREFH | 0 | VREFH | PASS |
| MP3 | Vth | VREFL+Vth | VREFL | PASS |
| MP5 | 1.8-VREFL | 0 | 1.8-VREFL | PASS |
| MP1 | 0 | 1.8-(VREFL+Vth) | 1.8-(VREFL+Vth) | PASS |
| MN2 | 0 | VREFH-Vth | VREFH-Vth | PASS |
| MN4 | Vth | 1.8-(VREFH-Vth) | 1.8-VREFH | PASS |
| MP4 | 1.8-VREFL | 0 | 1.8-VREFL | PASS |
| MP6 | Vth | VREFL+Vth | VREFL | PASS |
| MP2 | 1.8-(VREFL+Vth) | 0 | 1.8-(VREFL+Vth) | PASS |
| MP7 | 0 | 1.8-(VREFL+Vth) | 1.8-(VREFL+Vth) | PASS |
| MP8 | Vth | VREFL+Vth | VREFL | PASS |
| MN7 | VREFH | 0 | VREFH | PASS |
| MN8 | VREFH-Vth | 0 | VREFH-Vth | PASS |

FIG. 4B

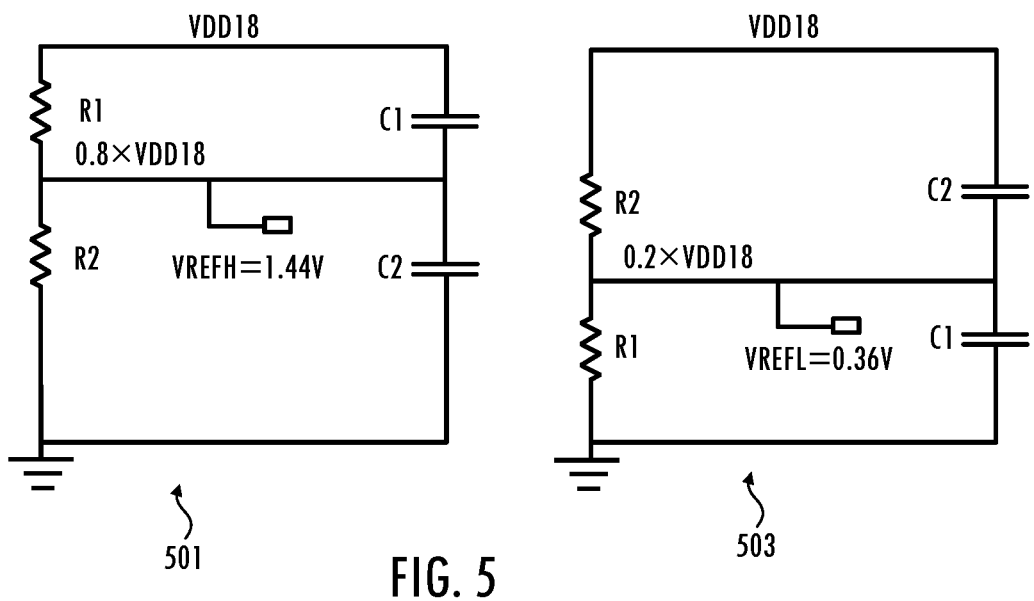

FIG. 5

Input=0.75V

| Device | \|Vgs(V)\| | \|Vds(V)\| | \|Vgd(V)\| | Stress Level |
|---|---|---|---|---|
| MN1 | 0 | VREFH-Vth | VREFH-Vth | PASS |
| MN3 | Vth | 1.8-(VREFH-Vth) | 1.8-VREFH | PASS |
| MP3 | 1.8-VREFL | 0 | 1.8-VREFL | PASS |
| MP5 | Vth | VREFL+Vth | VREFL | PASS |
| MP1 | 1.8-(VREFL+Vth) | 0 | 1.8-(VREFL+Vth) | PASS |
| MN2 | 0.75 | 0 | 0.75 | PASS |
| MN4 | VREFH | 0 | VREFH | PASS |
| MP4 | Vth | VREFL+Vth | VREFL | PASS |
| MP6 | 1.8-VREFL | 0 | 1.8-VREFL | PASS |
| MP2 | 0 | 1.8-(VREFL+Vth) | 1.8-(VREFL+Vth) | PASS |
| MP7 | 1.8-(VREFL+Vth) | 0 | 1.8-(VREFL+Vth) | PASS |
| MP8 | 1.8-VREFL | 0 | 1.8-VREFL | PASS |
| MN7 | Vth | 1.8-(VREFH-Vth) | 1.8-VREFH | PASS |
| MN8 | 0 | VREFH-Vth | VREFH-Vth | PASS |

FIG. 6B

LEVEL SHIFTING OUTPUT CIRCUIT

BACKGROUND

Description of the Related Art

Input/output (I/O) circuits are required for interaction between off-chip peripheral devices and internal circuits of integrated circuits. The peripheral devices typically operate on higher supply voltages than core circuits. As the technology nodes continue to shrink the core voltage is scaling down at a rapid pace but it has been observed that the I/O operating voltages are not scaling at the same rate. In technology nodes such as 90 nm and above, I/O circuits used 5V supply voltages and used thick oxide devices able to tolerate such high supply voltages across their terminals due to the increased thickness of the oxide layers. For technology nodes below 28 nm, thick oxide devices were able to tolerate only 1.8V across any terminals (gate-drain, gate-source, drain-source). That forced designers to use techniques such as stacking of devices to be able to operate at I/O domain supply voltages in the range of 3.3V. In latest technology nodes such as 5 nm and below, thick oxide devices are not able to tolerate voltages greater than 1.5V across their terminals and the I/O supply voltages are still at 1.8V. Since the core voltages have scaled significantly, the voltage difference between core voltage domain and I/O supply domains have also increased thereby increasing the overall difficulty in multi voltage I/O design.

Accordingly, it would be desirable to provide an output circuit for integrated circuits that functions safely in the latest technology nodes.

SUMMARY OF EMBODIMENTS OF THE INVENTION

In one embodiment a level shifting output circuit includes a first portion coupled to receive a signal from a core region of the integrated circuit that is generated using a first supply voltage. The level shifting output circuit further includes a driver circuit portion to supply an output signal to the output node of the level shifting output circuit. The driver circuit portion has a second supply voltage, that is higher than the first supply voltage. The first portion of the output circuit supplies a first control signal and a second control signal to the driver circuit portion, the first and second control signals having respective values being determined according to a value of the signal received by the output circuit. The driver circuit portion is coupled to a low reference voltage having a voltage value higher than a ground voltage and lower than the first supply voltage and the driver circuit portion is further coupled to a high reference voltage, the high reference voltage being higher than the low reference voltage and lower than the second supply voltage.

In an embodiment the driver circuit portion includes a first output driver transistor and a second output driver transistor in a pull-up portion of the driver circuit portion and a third output driver transistor and a fourth output driver transistor in a pull-down portion of the driver circuit portion. The first output driver transistor has a source node coupled to the second supply voltage and the first portion of the level shifting output circuit is configured to supply the first control signal to the first output driver transistor and to supply the second control signal to the fourth output driver transistor. A gate of the second output driver transistor is coupled to the low reference voltage and a gate of the third output driver transistor is coupled to the high reference voltage.

In an embodiment, the first control signal turns on the first output driver transistor with a first turn-on voltage that is greater than a ground voltage to avoid voltage overstress of the first output driver transistor. The second control signal turns on the fourth output driver transistor with a second turn-on voltage that is less than the second supply voltage to avoid voltage overstress of the fourth output driver transistor.

In another embodiment, a method of supplying a signal received by an output circuit to an output node of the output circuit and avoiding overvoltage conditions in the output circuit includes supplying the signal generated in a core using a first supply voltage to a first portion of the output circuit. The method further includes supplying a first transistor stack with a second supply voltage that is higher than the first supply voltage. A first plurality of protection transistors protect transistors in the first stack from voltage overstress conditions. A second stack of transistors is supplied with the second supply voltage. A second plurality of protection transistors protect transistors in the second stack from voltage overstress conditions. A first control signal and a second control signal are supplied from the second stack to an output driver circuit to control a value of the output signal on the output node. A third plurality of protection transistors in the output driver circuit are used to avoid voltage overstress conditions in the output driver circuit.

In another embodiment, a method of supplying a signal received by an output circuit to an output node of the output circuit includes receiving the signal from a first voltage domain, the first voltage domain having a first supply voltage. The output signal is supplied to the output node from a driver circuit that is operating in a second voltage domain with a second supply voltage, the second supply voltage being higher than the first supply voltage. A first control signal is supplied to a first transistor of the driver circuit from a first portion of the output circuit, the first control signal having a first turn-on voltage value to avoid a voltage overstress condition for the first transistor when the first transistor is turned on and a second control signal is supplied to a second transistor of the driver circuit to determine a value of the output signal. The second control signal has a second turn-on value to avoid an overvoltage condition for the second transistor when the second transistor is turned on. The first and second control signals have respective values being determined according to a value of the signal received by the output circuit. A gate of a third transistor disposed between the first transistor and the output node is supplied with a low reference voltage having a voltage value between a ground voltage and the first supply voltage and a gate of a fourth transistor between the output node and the second transistor is supplied with a high reference voltage having a voltage value between the low reference voltage and the second supply voltage.

BRIEF DESCRIPTION OF THE DRAWINGS

The present invention may be better understood, and its numerous objects, features, and advantages made apparent to those skilled in the art by referencing the accompanying drawings.

FIG. 4B illustrates in tabular form the magnitude of voltages Vgd, Vgs, and Vds of various transistors shown in the output circuit of FIG. 4A showing safe operating conditions.

FIG. 5 illustrates an embodiment for generating VREFH and VREFL using resistive divider circuits.

FIG. 6B illustrates in tabular form the magnitude of voltages Vgd, Vgs, and Vds across various transistors shown in the output circuit of FIG. 6A showing safe operating conditions.

The use of the same reference symbols in different drawings indicates similar or identical items.

DETAILED DESCRIPTION

Figure 1:
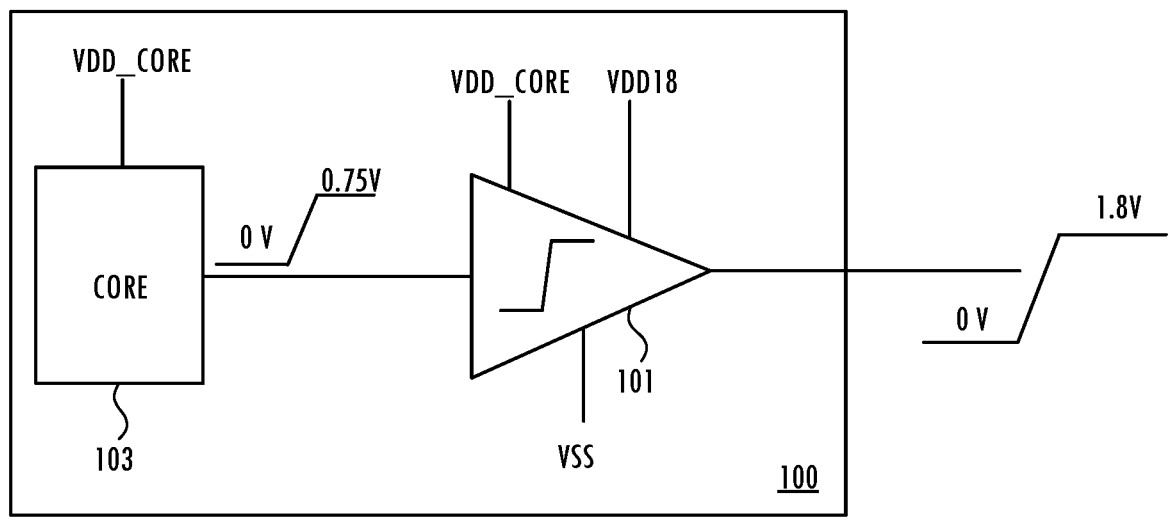
FIG. 1 illustrates a high level block diagram of an integrated circuit having an output circuit that provides an interface for the communication between the integrated circuit core and higher voltage external devices.

FIG. 1 illustrates a high level block diagram of an integrated circuit 100, e.g., a processor, having an output circuit 101 that provides an interface used at the periphery of the integrated circuit 100 for the communication between the integrated circuit core 103 and the external world. Level shifting output circuits are an integral part of multi-voltage designs as they enable voltage shifting between the core domain voltage and the higher I/O domain voltage. For example, the level shifting output circuit 101 shifts voltage levels from a core domain voltage of, e.g., 0.75V, to an I/O domain voltage of, e.g., 1.8V. In advanced technology nodes like 5 nm, the need to support an I/O domain voltage of 1.8V and protect the I/O devices from overvoltage stress makes design of conventional level shifting output circuits difficult.

In 5 nm technology nodes, some foundries do not support 1.8V I/O devices and instead such foundries only support 1.5V I/O devices, which are capable of handling a maximum of 1.65V across their terminals. However, the I/O interface still needs to work at a higher supply voltage such as 1.8V. In order to support the industry standard I/O interface specifications, e.g., JEDEC, MIPI, 5 nm process nodes that are limited to devices that handle less voltage (e.g., 1.65V) than the I/O voltage domain across their terminals require level shifting output circuits that can handle the I/O domain voltage (1.8V) without creating reliability concerns due to voltage overstress.

Figures 2A, 2B:
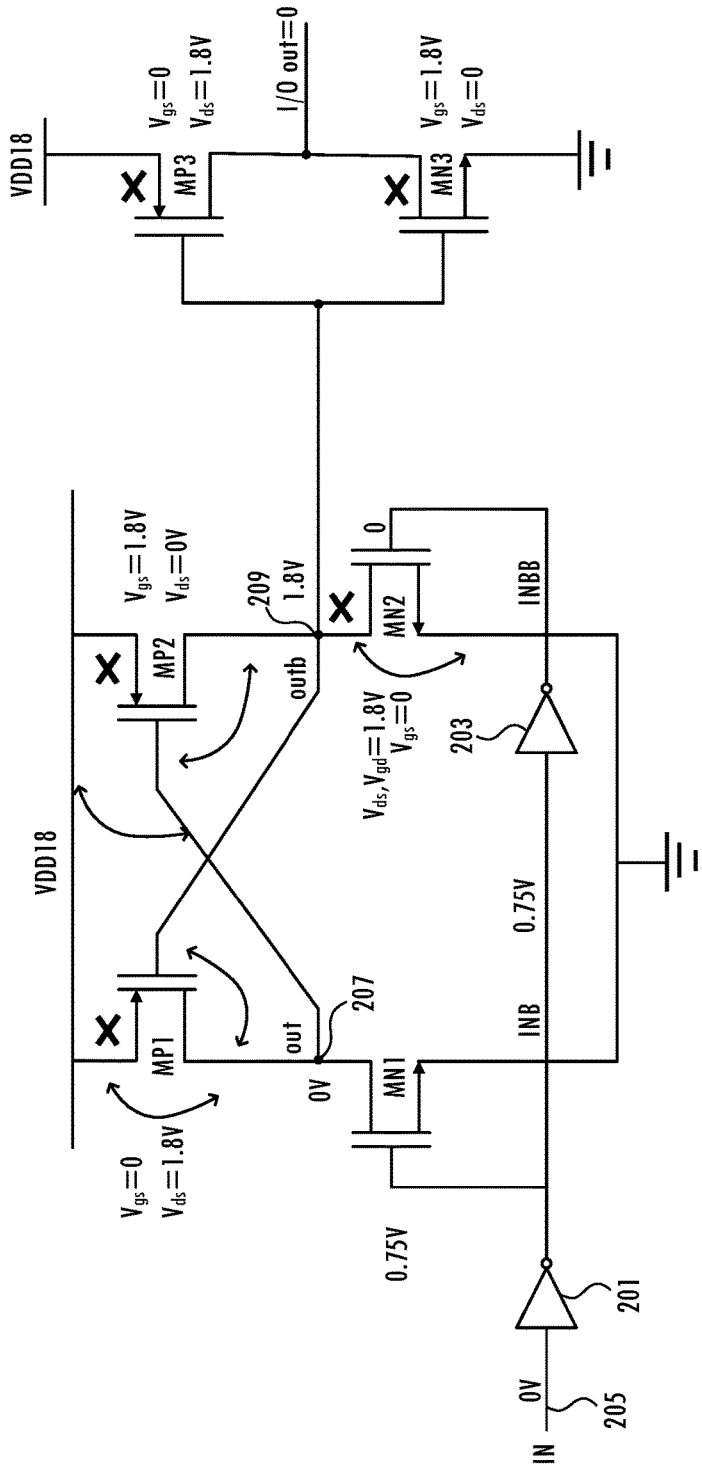
FIG. 2A illustrates a conventional level shifter topology for an output circuit that receives a signal to be output at a first voltage level.
FIG. 2B illustrates in tabular form which transistor terminals have overvoltage conditions in the circuit shown in FIG. 2A.

Referring to FIG. 2A, assume a conventional level shifter topology is used in a 5 nm technology node to convert a core voltage 0.75V to 1.8V voltage. As explained below, such an approach exposes the PMOS devices MP1 and MP2 to a 1.8V voltage across gate to source terminals. The approach also exposes NMOS devices MN1 and MN2 across drain to source terminals to 1.8V, causing an increased risk of overvoltage failure.

Still referring to FIG. 2A, assume input 205 is 0. Inverter 201 and inverter 203 are in the core voltage domain of 0.75V. When the input 205 is zero, the inverter 201 supplies a logical 1 at 0.75V causing NMOS MN1 to be ON and inverter 203 supplies a 0 causing MN2 to be OFF. That results in the voltage at node 207 to be 0 (out=0) and the voltage at node 209 (outb=1.8V) as shown in FIG. 2A. PMOS transistor MP2 sees a gate to source voltage Vgs of 1.8V and a gate to drain voltage (Vgd) of 1.8V. NMOS transistor MN2 sees a drain to source voltage Vds=1.8V and a gate to drain voltage Vgd=1.8V. PMOS transistor MP1 has 1.8V across drain to source (Vds) terminals and gate to drain (Vgd) causing overvoltage across MP1, MP2, and MN2. Note also that MP3 has Vgd=1.8V and MN3 has Vgd=1.8V and Vgs=1.8V. FIG. 2B shows voltage across different terminals of the MOS devices.

Figures 3A, 3B:
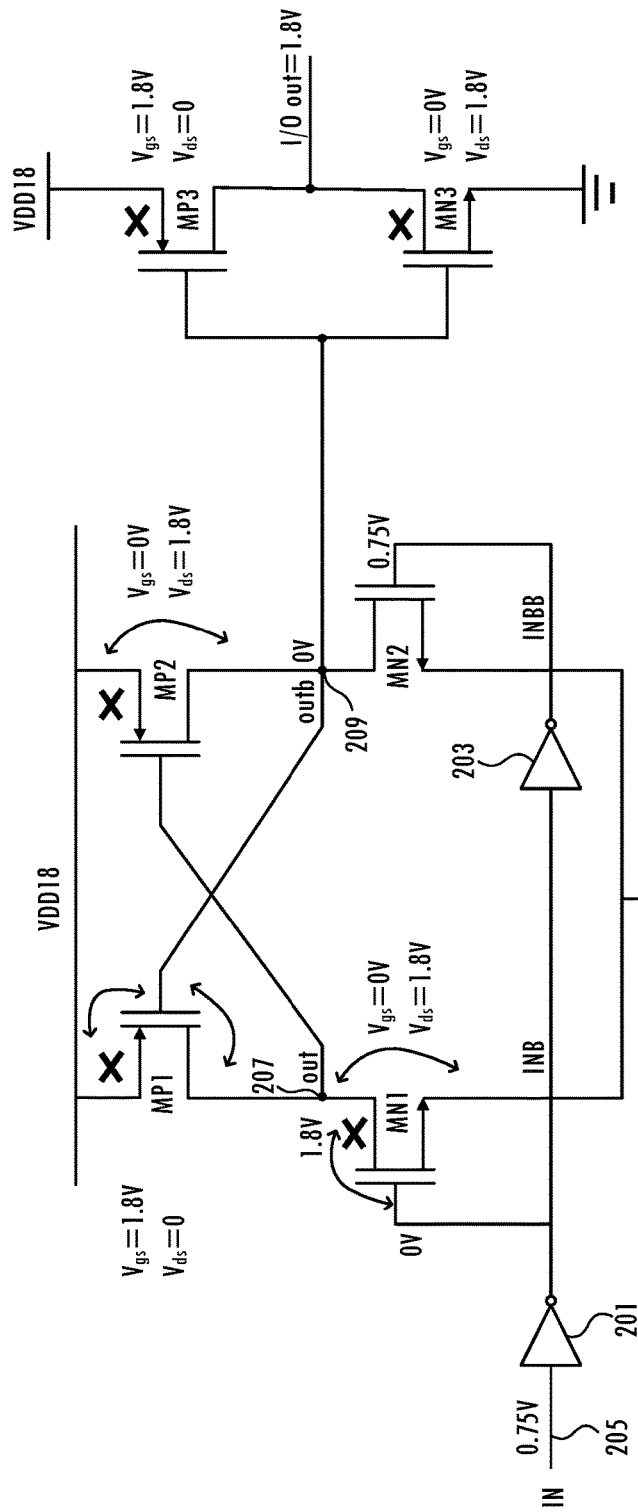
FIG. 3A illustrates a conventional level shifter topology in an output circuit that receives a signal to be output at a second voltage level.
FIG. 3B illustrates in tabular form which transistor terminals have overvoltage conditions in the circuit shown in FIG. 3A.

Referring to FIG. 3A, when data input signal 205 (IN) is 0.75V, inverter 201 supplies 0V causing NMOS MN1 to be OFF and inverter 203 supplies 0.75V causing MN2 to be ON. The value of the gate to source voltage Vgs for MN2 at 0.75V causes the voltage at node 209 (outb) to be 0V. Low voltage at outb turns on MP1 and the gate to source voltage (Vgs) of MP1 is 1.8V, which causes over-stress across the gate to source terminals. Since MP1 is turned ON node 207 (out) is also at 1.8V causing gate to drain voltage for MP1 to be 1.8V and device MP1 is over-stressed. Since node 207 (out) is at 1.8V, the gate to source voltage (Vgs) for device MP2 is 0 which makes MOS MP2 be OFF and the node outb is at 0 hence the drain to source voltage Vds and gate to drain voltage Vgd of the PMOS MP2 is 1.8V causing overstress across the gate to drain and drain to source terminals. With node 209 at 0V, MP3 turns on and MN3 turns off causing the gate to drain and gate to source voltages of MP3 to be 1.8V resulting in overstress of MP3. With I/O out at 1.8V the gate to drain voltage (Vgd) of MN3 1.8V and Vds=1.8V resulting in overstress of MN3. FIG. 3B shows the various terminal voltages for the transistors of FIG. 3A. Note that the "X" adjacent to transistors in FIGS. 2A and 3A indicate an overvoltage condition for the adjacent transistor.

Figure 4A:
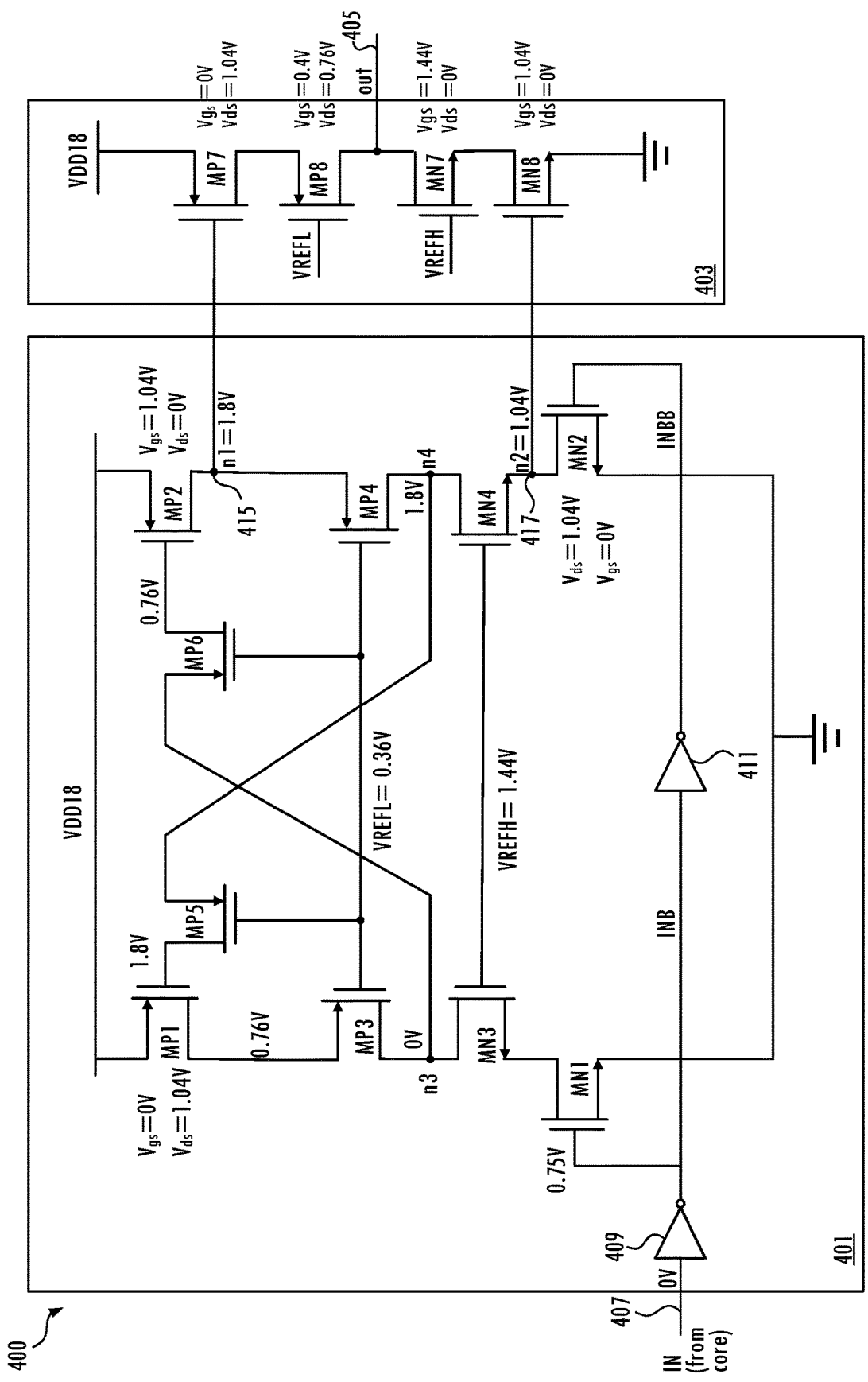
FIG. 4A illustrates an embodiment of an output circuit that avoids voltage overstress conditions.

FIG. 4A illustrates an embodiment of an output circuit 400 that avoids overstress conditions. The output circuit includes a first portion 401 that functions to help shift the voltage level from the core voltage domain to the I/O voltage domain. The first portion 401 receives an input signal IN from a core voltage domain of 0.75V and includes a driver portion 403 that supplies an output signal 405 with a voltage of the I/O domain at 1.8V. In output circuit 400, extra stacked devices MP3 and MP4 are added to reduce stress due to high drain to source voltage for the PMOS MP1 and MP2 transistors. Transistors MP5 and MP6 are added in series with gate of MP1 and MP2 to reduce Vgs and eliminate overstress between the gate to source terminals. Similarly, stacked devices MN3 and MN4 are added to protect the NMOS devices MN1 and MN2. The output circuit 400 utilizes intermediate voltages VREFH and VREFL for biasing the protection devices MP3, MP4, MN3, and MN4. In an embodiment VREFH=1.44V and VREFL=0.36V.

Assume the input IN 407 comes from the core logic having a voltage domain with a supply voltage of 0.75V. When IN is 0, the output of inverter 409 is at 0.75V making the gate voltage of MN1 0.75V. Thus, the gate to source voltage Vgs of the NMOS MN1 is at 0.75V causing MN1 to turn ON and pull the drain node of MN1 to ground. Inverter 411 supplies the gate of MN2 with zero volts causing MN2 to be OFF. Note that the inverters 409 and 411, while part of the first portion 401, utilize the core supply voltage 0.75V. The gate of MOS MN3 is biased at VREFH and thus Vgs for MN3 is at VREFH causing MN3 to turn ON and the drain node of MN3 is pulled down to 0. Due to MP6, the gate node for PMOS MP2 receives a voltage of VREFL+Vth=0.76V instead of 0V as in the approach illustrated in FIG. 3A, causing MOS MP2 to turn ON pulling the drain node of the MOS MP2 to 1.8V. Note that the threshold voltage Vth of the PMOS devices is approximately 0.3 to 0.5 V and for the purposes of FIG. 4A the threshold voltage is assumed to be 0.4V. Since MOS MP4 has a gate node tied to VREFL, gate to source voltage Vgs for MP4 becomes 1.8-VREFL which causes PMOS MP4 to turn ON. Nodes n1 415 and n2 417 are connected to PMOS MP7 and NMOS MN8, respectively. These MOS devices are stacked with MOS devices MN7 and MP8 whose gates are tied to VREFH and VREFL, respectively, giving MP7 and MN8 control for turning ON and OFF the output driver. In this case, node n1 is at 1.8V and node n2 is at 1.04V causing MN8 to be on and output signal (out) 405 to be pulled to ground through MN7 and MN8 to thereby correspond to the input signal 407. Note the gate voltage at MN8 (1.04V) is high enough to turn on MN8 without causing voltage overstress.

FIG. 4B is a table illustrating the magnitude of voltages Vgd, Vgs, and Vds across nodes of the transistors shown in the output circuit 400 shown in FIG. 4A. As can be seen, the voltages are safe (less than maximum tolerated voltage, e.g., 1.65V) because the devices in output circuit 400 are protected from overvoltage due to the use of the various protection transistors.

FIG. 5 illustrates an embodiment for generating VREFH and VREFL using resistive divider circuits 501 and 503. The embodiment of FIG. 5 generates VREFH=1.44 and VREFL=0.36V.

Figure 6A:
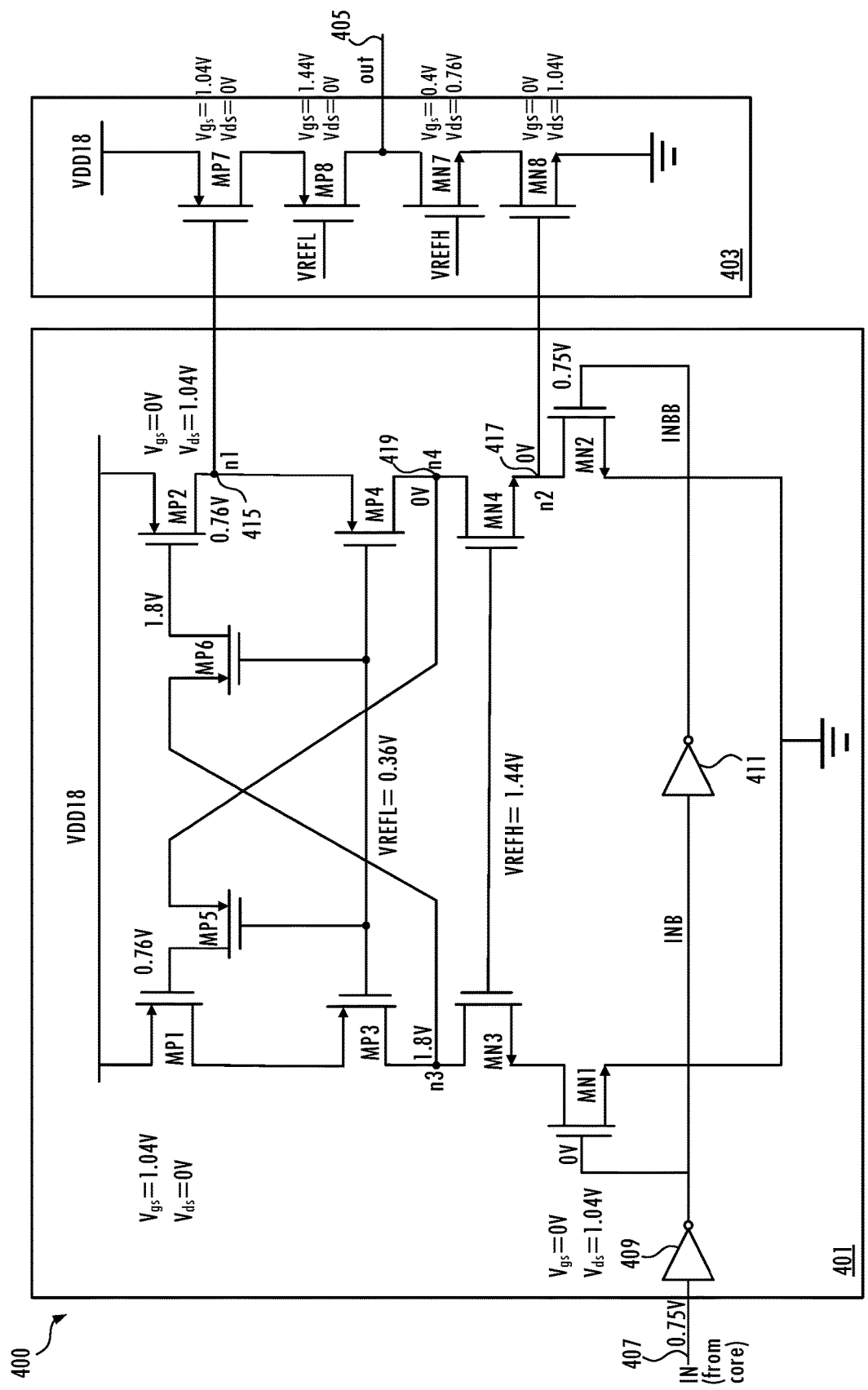
FIG. 6A illustrates an embodiment of an output circuit that avoids voltage overstress conditions.

FIG. 6A illustrates operation of the output circuit 400 when the data signal (IN) is at 0.75V. When IN is 0.75V, the output of the inverter 409 is 0 and output of the inverter 411 is 0.75V. As Vgs for MN2 is 0.75V, NMOS MN2 turns ON which causes node 417 (n2) to be pulled to ground. The gate of MOS MN4 is at VREFH and the source at node 417 (n2) is at 0 thus Vgs of MN4 is VREFH causing MN4 to be ON pulling the drain of MN4 at node 419 (n4) to 0. PMOS MP5 has its gate node tied to VREFL causing VREFL+Vth= (0.76V) instead of 0V as in the approach shown in FIG. 3A, to be transferred to the gate node of MP1 turning MP1 ON without overstress across gate to source voltage and the drain node is at 1.8V. Note that the threshold voltage Vth of the PMOS device shown is approximately 0.3 to 0.5 V and for the purposes of FIG. 6A the threshold voltage is assumed to be 0.4V. Since gate node of MP3 is tied to VREFL MOS MP3 turns ON causing its drain node to be at 1.8V. MOS MP6 transfers this node voltage to the gate node of MP2 causing MP2 to turn OFF. That results in the drain node n1 of MP2 having node voltage VREFL+Vth. Node voltages 415 (n1) and 417 (n2) are applied to output driver 403. Since node 417 (n2) is 0, NMOS MN8 turns off, MOS MP7 has gate to source voltage Vgs at 1.8-VREFL turning MP7 ON pulling the output node 405 to 1.8V. Note that the gate voltage of MP7 is low enough (0.76V) to turn on MP7 without causing voltage overstress.

FIG. 6B is a table showing the magnitude of voltages Vgd, Vgs, and Vds across nodes of the transistors when the input from the core is 0.75V as shown in FIG. 6A. As can be seen from the table, the devices in output circuit 400 are protected from over voltage due to the use of the various protection transistors. Thus, the embodiment of output circuit 400 provides an output circuit that shifts from a core voltage 0.75V to a 1.8V voltage domain level that can be used in various multi-voltage applications that are required to operate in the core voltage domain as well as 1.8V voltage domains.

Figure 7:
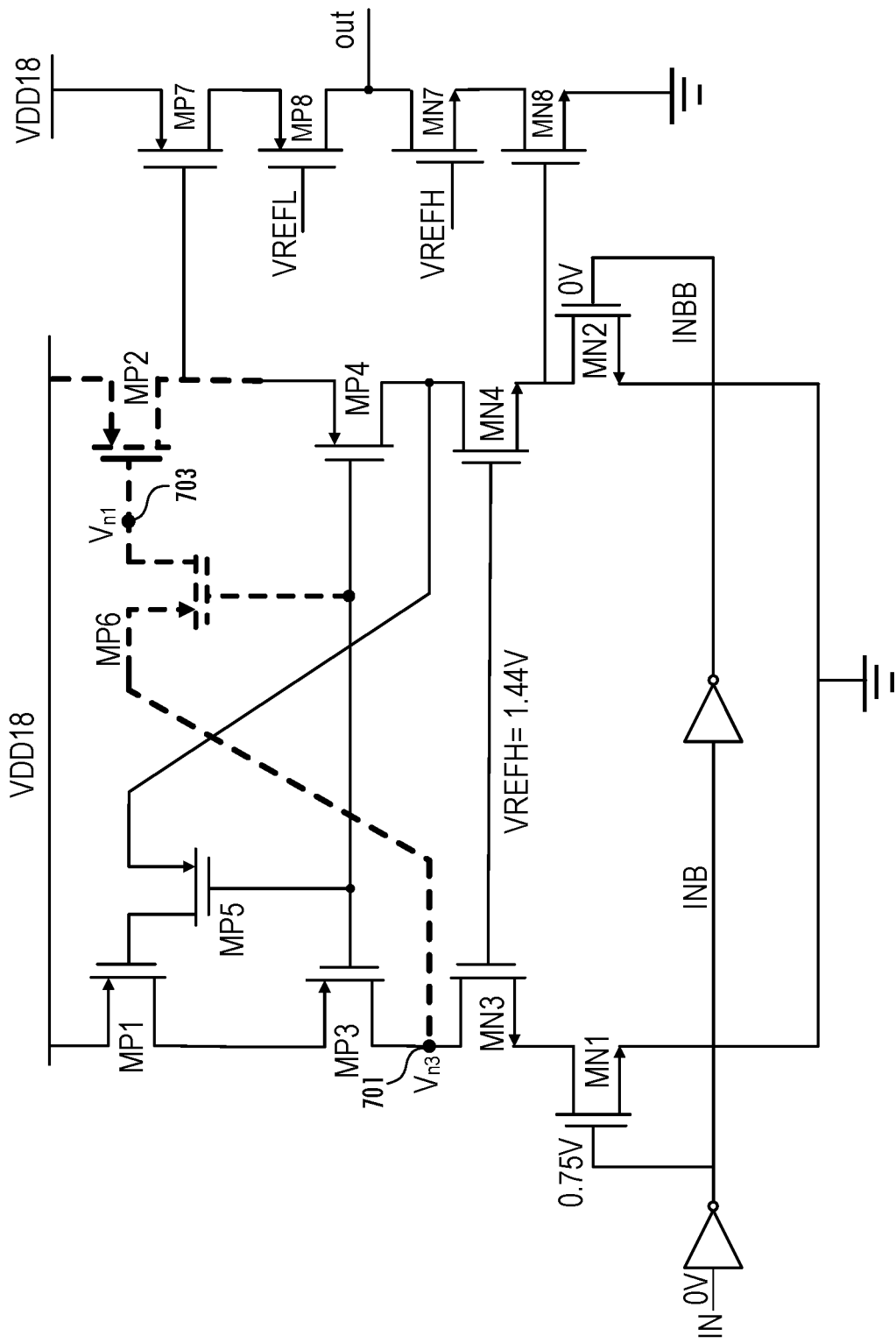
FIG. 7 highlights the gate protection circuit for a level shifter transistor.
Figure 8:
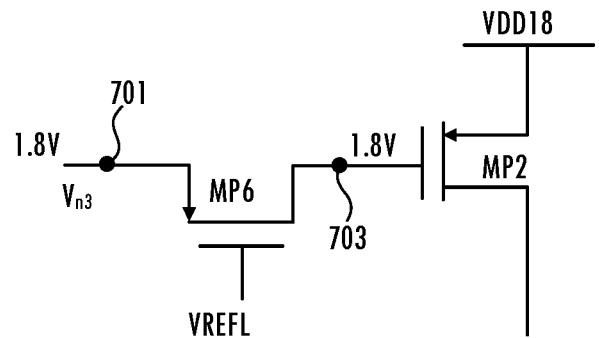
FIG. 8 illustrates operation of the gate protection circuit for a transistor in the first portion of the output circuit when in the gate of the transistor receives a high voltage.
Figure 9:
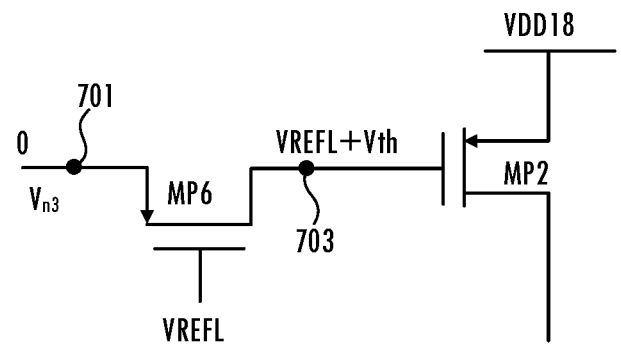
FIG. 9 illustrates desired operation of the gate protection circuit for a transistor in the first portion of the output circuit when the gate of the transistor is floating.
Figure 10:
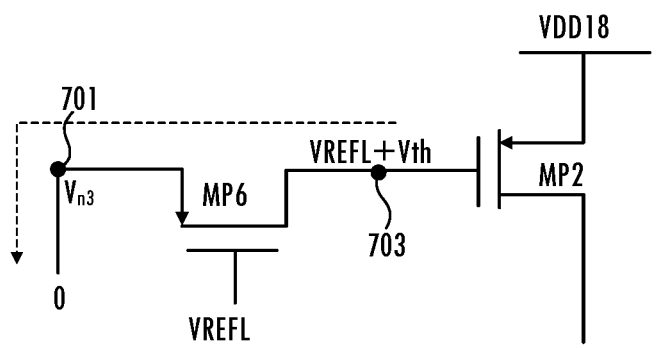
FIG. 10 illustrates leakage current through a protection transistor when the gate of the transistor being protected is floating.

Referring to FIG. 7, the half circuit diagram for the gate protection circuit that includes MP6 is highlighted in FIG. 7 by dashed lines. FIG. 8 shows that when node 701 (Vn3) is 1.8V, MP6 is ON and node 703 is at 1.8. Referring to FIG. 9, when the node voltage Vn3 at node 701 is at 0 pass transistor MP6 is off. Node 703 (the gate of MP2) is floating rather than attaining or maintaining the desired fixed voltage VREFL+Vth. Referring to FIG. 10, due to the small channel length of transistor MP6, leakage current flows through MOS MP6 to node 701, which is at 0V. The leakage current makes the node voltage at node 703 more indeterministic.

Figure 11:
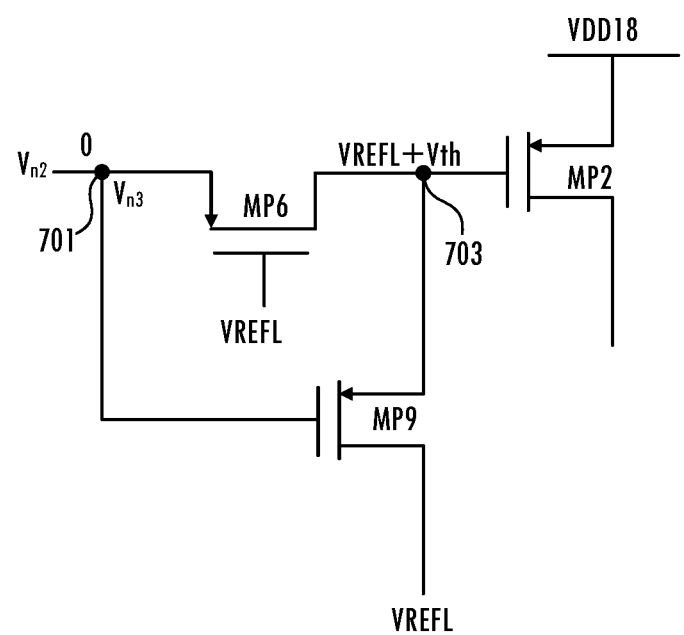
FIG. 11 illustrates an embodiment of a gate protection circuit to set the gate of the transistor being protected to a minimum of a low reference voltage.

Referring to FIG. 11, the embodiment illustrates an approach to fix the floating node at node 703 when node 701 is 0. The circuit shown in FIG. 11 achieves that by providing an alternate path to node 703 when node 703 is 0. Transistor MP9 has its gate tied to node 701. When node 701 is at 0V, MP9 is ON, which ties the node 703 to VREFL (at a minimum). The node voltage at node 703 may further include Vth or a portion of Vth. Thus, MOS transistor MP9 provides an alternate path to the gate of MOS transistor MP2 to prevent node 703 from becoming indeterministic. That ensures that Vgs at MP2 avoids an overvoltage condition when node 701 is at 0V.

Figure 12:
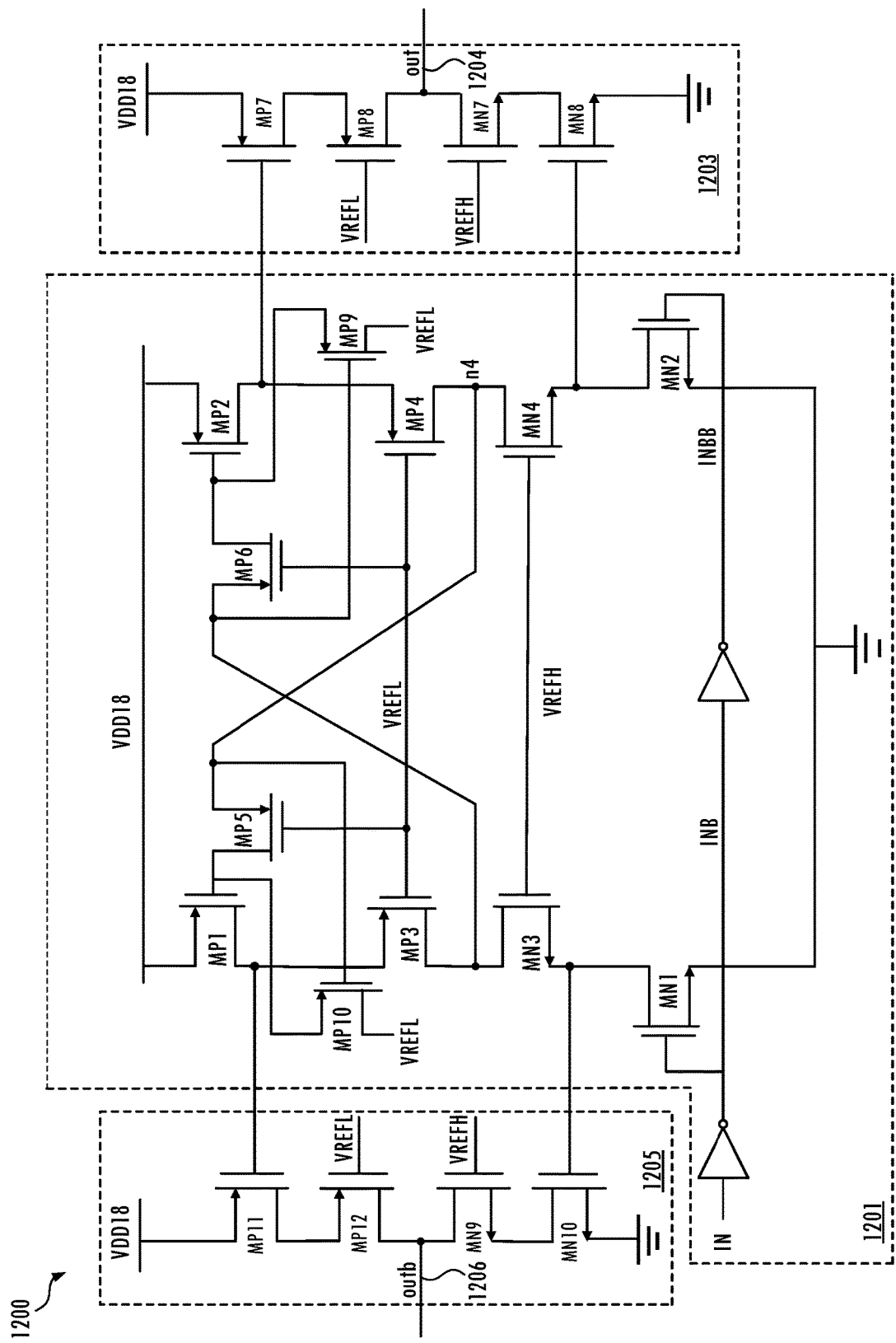
FIG. 12 illustrates an embodiment of an output circuit that avoids voltage overstress conditions.

FIG. 12 illustrates an embodiment of the level shifting output circuit 1200 that includes a first portion 1201 of the output circuit, a driver portion 1203 to supply an output signal 1204 (out) and a driver portion 1205 to provide a complementary output 1206 (outb) to thereby provide a differential output signal. Output circuit 1200 includes transistor MP9 shown in FIG. 11 to prevent the gate of MP2 from becoming indeterministic. Output circuit further includes transistor MP10 serving the same function as transistor MP9, except for the transistor MP1. Thus, transistor MP9 ensures that the gate of MP1 maintains a minimum voltage of VREF when node n4 is at 0V and MP5 is OFF. The transistors MP3, MP5, MP10, and MN3 provide protection to the stack of transistors with MP1 at the top and MN1 at the bottom of the stack. The transistors MP4, MP6, MP9, and MN4 provide protection to the stack of transistors with MP2 at the top and MN2 at the bottom. Transistors MP8 and MN7 provide protection for the output stack with transistor MP7 at the top and MN8 at the bottom of the stack.

Thus, the description of the invention set forth herein is illustrative and is not intended to limit the scope of the invention as set forth in the following claims. Variations and modifications of the embodiments disclosed herein, may be made based on the description set forth herein, without departing from the scope of the invention as set forth in the following claims.

What is claimed is:

1. A level shifting output circuit of an integrated circuit comprising:
   a first portion of the level shifting output circuit coupled to receive a signal from a core region of the integrated circuit, the signal from the core region being generated using a first supply voltage;
   a first driver circuit portion to supply an output signal to a first output node of the level shifting output circuit, the first driver circuit portion having a second supply voltage, the second supply voltage being higher than the first supply voltage;
   wherein the first portion of the level shifting output circuit is configured to supply a first control signal and a second control signal to the first driver circuit portion, the first and second control signals having respective values being determined according to a value of the signal received by the level shifting output circuit;
   a second driver circuit portion to supply a second output signal to a second output node of the level shifting output circuit, the second driver circuit portion coupled to the second supply voltage;
   wherein the first portion of the level shifting output circuit is configured to supply a third control signal and a fourth control signal to the second driver circuit portion, the third control signal and the fourth control signal having respective values being determined according to a value of the signal received by the level shifting output circuit;
   wherein the first driver circuit portion and the second driver circuit portion are coupled to a low reference voltage (VREFL) having a voltage value higher than a ground voltage and lower than the first supply voltage; and
   wherein the first driver circuit portion and the second driver circuit portion are further coupled to a high reference voltage (VREFH), the high reference voltage being higher than the low reference voltage and lower than the second supply voltage.

2. The level shifting output circuit as recited in claim 1, wherein the first driver circuit portion includes a first output driver transistor and a second output driver transistor in a pull-up portion of the first driver circuit portion and a third output driver transistor and a fourth output driver transistor in a pull-down portion of the first driver circuit portion, the first output driver transistor having a source node coupled to the second supply voltage;
   wherein the first portion of the level shifting output circuit is configured to supply the first control signal to the first output driver transistor and to supply the second control signal to the fourth output driver transistor;
   wherein a gate of the second output driver transistor is coupled to the low reference voltage; and
   wherein a gate of the third output driver transistor is coupled to the high reference voltage.

3. The level shifting output circuit as recited in claim 2, wherein the first, second, third, and fourth output driver transistors have a voltage tolerance across their terminals less than the second supply voltage.

4. The level shifting output circuit as recited in claim 2, wherein the first control signal turns on the first output driver transistor with a first turn-on voltage, the first turn-on voltage being greater than a ground voltage to avoid voltage overstress of the first output driver transistor; and
   wherein the second control signal turns on the fourth output driver transistor with a second turn-on voltage, the second turn-on voltage being less than the second supply voltage to avoid voltage overstress of the fourth output driver transistor.

5. The level shifting output circuit as recited in claim 3 wherein the second supply voltage is nominally 1.8V and the voltage tolerance is less than 1.8V.

6. The level shifting output circuit as recited in claim 4 further comprising:
   a first voltage divider circuit to provide the low reference voltage; and
   a second voltage divider circuit to provide the high reference voltage.

7. The level shifting output circuit as recited in claim 4 wherein the first portion of the level shifting output circuit further includes,
   a first level shifter transistor, a second level shifter transistor, a third level shifter transistor, a fourth level shifter transistor, a fifth level shifter transistor, a sixth level shifter transistor, a seventh level shifter transistor, and an eighth level shifter transistor;
   wherein the fifth level shifter transistor, the seventh level shifter transistor, the third level shifter transistor, and the first level shifter transistor are arranged in a first stack;
   a first inverter having an input coupled to the signal to be output and a first inverter output coupled to a gate of the first level shifter transistor; and
   wherein the first level shifter transistor, the second level shifter transistor, the third level shifter transistor, the fourth level shifter transistor, the fifth level shifter transistor, the sixth level shifter transistor, the seventh level shifter transistor, and the eighth level shifter transistor have a voltage tolerance across their terminals less than the second supply voltage.

8. The level shifting output circuit as recited in claim 7 wherein the first portion of the level shifting output circuit further comprises:
   a second stack formed by the sixth level shifter transistor, the eighth level shifter transistor, the fourth level shifter transistor, and the second level shifter transistor; and
   a second inverter coupled to the first inverter output and supplying a second inverter output to a gate of the second level shifter transistor.

9. The level shifting output circuit as recited in claim 8 wherein the first inverter and the second inverter operate with the first supply voltage.

10. The level shifting output circuit as recited in claim 8 wherein the first output driver transistor, the second output driver transistor, the fifth level shifter transistor, the sixth level shifter transistor, the seventh level shifter transistor, and the eighth level shifter transistor are PMOS transistors, and sixth, ninth, and tenth transistors are PMOS transistors and the third output driver transistor, the fourth output driver transistor, the first level shifter transistor, the second level shifter transistor, the third level shifter transistor, and the fourth level shifter transistor are NMOS transistors.

11. The level shifting output circuit as recited in claim 8, wherein a gate of the third level shifter transistor and a gate of the fourth level shifter transistor are coupled to the high reference voltage; and
   wherein a gate of the seventh level shifter transistor is coupled to the low reference voltage and a gate of the eighth level shifter transistor is coupled to the low reference voltage.

12. The level shifting output circuit as recited in claim 11 wherein the first portion of the level shifting output circuit further comprises:
- a ninth level shifter transistor having a first current carrying terminal coupled to a gate of the fifth level shifter transistor and a second current carrying terminal coupled to a first node between the fourth level shifter transistor and the eighth level shifter transistor, a gate node of the ninth level shifter transistor coupled to the low reference voltage, the ninth level shifter transistor to provide overvoltage protection to the fifth level shifter transistor.

13. The level shifting output circuit as recited in claim 12 wherein the first portion of the level shifting output circuit further comprises:
- a tenth level shifter transistor having a third current carrying terminal coupled to a gate of the sixth level shifter transistor and a fourth current carrying terminal coupled to a second node between the third level shifter transistor and the seventh level shifter transistor and having a gate node of the tenth level shifter transistor coupled to the low reference voltage, the tenth level shifter transistor to provide overvoltage protection to the sixth level shifter transistor.

14. The level shifting output circuit as recited in claim 13 wherein the first portion of the level shifting output circuit further comprises:
- an eleventh level shifter transistor having a fifth current carrying terminal coupled to the gate of the fifth level shifter transistor and a sixth current carrying terminal coupled to the low reference voltage and a gate of the eleventh level shifter transistor being coupled to the first node; and
- a twelfth level shifter transistor having a seventh current carrying terminal coupled to the gate of the sixth level shifter transistor and an eighth current carrying terminal coupled to the low reference voltage and a gate of the twelfth level shifter transistor being coupled to the second node.

15. The level shifting output circuit as recited in claim 14 wherein a voltage tolerance of the first, second, third, fourth, fifth, sixth, seventh, eighth, ninth, tenth, eleventh and twelfth level shifter transistors is less than the second supply voltage.

16. A method of supplying an input signal received by an output circuit to an output node of the output circuit and avoiding overvoltage conditions in the output circuit, the method comprising:
- supplying the input signal generated in a core using a first supply voltage to a first portion of the output circuit;
- supplying a first stack of transistors with a second supply voltage and a ground voltage, the second supply voltage being higher than the first supply voltage;
- using a first plurality of protection transistors in the first stack to protect transistors in the first stack from overvoltage conditions;
- supplying a second stack of transistors with the second supply voltage and the ground voltage;
- using a second plurality of protection transistors in the second stack to protect transistors in the second stack from overvoltage conditions;
- supplying a first control signal and a second control signal from the second stack to an output driver circuit to control a value of an output signal on the output node; and
- using a third plurality of protection transistors in the output driver circuit to avoid overvoltage conditions in the output driver circuit.

17. The method as recited in claim 16 comprising:
- supplying the first control signal to a gate of a first output driver transistor having a source node coupled to the second supply voltage;
- supplying a gate of a second output driver transistor disposed between the output node and the first output driver transistor with a low reference voltage having a voltage value between the first supply voltage and the second supply voltage, the second output driver transistor being one of the third plurality of protection transistors;
- supplying a gate of a third output driver transistor disposed between the output node and a fourth output driver transistor with a high reference voltage having a voltage value between the low reference voltage and the second supply voltage, the third output driver transistor being another one of the third plurality of protection transistors; and
- supplying the second control signal to a gate of the fourth output driver transistor having a source terminal coupled to ground.

18. The method as recited in claim 17 further comprising:
- receiving the input signal at a first inverter that uses the first supply voltage and generating a first inverter output signal;
- supplying the first inverter output signal to a gate of a first level shifter transistor in the first stack of transistors;
- supplying the first inverter output signal to a second inverter that uses the first supply voltage and generating a second inverter output signal; and
- supplying the second inverter output signal to a gate of a second level shifter transistor in the second stack of transistors.

19. The method as recited in claim 18 further comprising:
- supplying a gate of a third level shifter transistor disposed between the first level shifter transistor and a first level shifter node in the first stack with the high reference voltage, the third level shifter transistor being one of the first plurality of protection transistors; and
- supplying a gate of a fourth level shifter transistor disposed between the second level shifter transistor and a second level shifter node in the second stack with the high reference voltage to thereby protect the second level shifter transistor from overvoltage, the fourth level shifter transistor being one of the second plurality of protection transistors.

20. The method as recited in claim 19 further comprising:
- supplying a source node of a fifth level shifter transistor in the first stack of transistors with the second supply voltage;
- supplying a source node of a sixth level shifter transistor in the second stack of transistors with the second supply voltage;
- supplying a gate of a seventh level shifter transistor disposed between the fifth level shifter transistor and the first level shifter node in the first stack with the low reference voltage, the seventh level shifter transistor being another one of the first plurality of protection transistors; and
- supplying a gate of an eighth level shifter transistor disposed between the sixth level shifter transistor and the second level shifter node in the second stack with the low reference voltage, the eighth level shifter transistor being another one of the second plurality of protection transistors.

21. The method as recited in claim 20 further comprising:
supplying a gate of a ninth level shifter transistor with the low reference voltage, the ninth level shifter transistor being a third of the first plurality of protection transistors;
supplying a gate of a tenth level shifter transistor with the low reference voltage, the tenth level shifter transistor being a third of the second plurality of protection transistors;
supplying a gate of the fifth level shifter transistor from a first current carrying terminal of the ninth level shifter transistor, a second current carrying terminal of the ninth level shifter transistor coupled to the second level shifter node;
supplying a gate of the sixth level shifter transistor from a first current carrying terminal of the tenth level shifter transistor, a second current carrying terminal of the tenth level shifter transistor coupled to the first level shifter node;
supplying a current carrying terminal an eleventh level shifter transistor with the low reference voltage, the eleventh level shifter transistor being a fourth of the first plurality of protection transistors;
using the eleventh level shifter transistor to define a gate node of the fifth level shifter transistor responsive to the second level shifter node being at a voltage level causing the ninth level shifter transistor to be off;
supplying a current carrying terminal of a twelfth level shifter transistor with the low reference voltage, the eleventh level shifter transistor being a fourth of the second plurality of protection transistors; and
using the twelfth level shifter transistor to define a gate node of the sixth level shifter transistor responsive to the first level shifter node being at the voltage level causing the tenth level shifter transistor to be off.

22. A method of operating an output circuit, the method comprising:
receiving at the output circuit an input signal from a region of an integrated circuit operating in a first voltage domain, the first voltage domain having a first supply voltage;
supplying a first output signal to a first output node of the output circuit from a first driver circuit operating in a second voltage domain with a second supply voltage, the second supply voltage being higher than the first supply voltage;
supplying a second output signal to a second output node of the output circuit from a second driver circuit operating in the second voltage domain, the first output signal and the second output signal being complementary;
supplying a first control signal to a first transistor of the first driver circuit from a first portion of the output circuit and supplying a second control signal to a second transistor of the first driver circuit from the first portion of the output circuit to determine a value of the first output signal, the first control signal having a first turn-on voltage value to avoid over voltage conditions for the first transistor when the first transistor is turned on and the second control signal having a second turn-on value to avoid overvoltage conditions for the second transistor when the second transistor is turned on;
supplying a third control signal to a third transistor of the second driver circuit from the first portion of the output circuit and supplying a fourth control signal to a fourth transistor of the second driver circuit from the first portion of the output circuit to determine a value of the second output signal;
determining respective values of the first, second, third, and fourth control signals according to a value of the input signal received by the output circuit;
supplying a gate of a third transistor between the first transistor and the first output node with a low reference voltage having a voltage value between a ground voltage and the first supply voltage; and
supplying a gate of a fourth transistor between the first output node and the second transistor with a high reference voltage having a voltage value between the low reference voltage and the second supply voltage.

23. The method as recited in claim 22 wherein the third control signal has the first turn-on voltage value to avoid over voltage conditions for the third transistor when the third transistor is turned on and the fourth control signal has the second turn-on value to avoid overvoltage conditions for the fourth transistor when the fourth transistor is turned on.

24. The method as recited in claim 16 further comprising using a third plurality of protection transistors that are not in the first stack to protect one of the transistors in the first stack and using a fourth plurality of protection transistors that are not in the second stack to protect one of the transistors in the second stack.

* * * * *